(12) United States Patent
Kim et al.

(10) Patent No.: US 8,729,468 B2
(45) Date of Patent: May 20, 2014

(54) MICROELECTRONIC SUBSTRATE INSPECTION EQUIPMENT USING HELIUM ION MICROSCOPY

(75) Inventors: Min-Kook Kim, Goyang-si (KR); Woo-Seok Ko, Seoul (KR); Yu-Sin Yang, Seoul (KR); Sang-Kil Lee, Yongin-si (KR); Chang-Hoon Choi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/596,644

(22) Filed: Aug. 28, 2012

(65) Prior Publication Data
US 2013/0175445 A1    Jul. 11, 2013

(30) Foreign Application Priority Data
Jan. 11, 2012  (KR) .......................... 10-2012-0003497

(51) Int. Cl.
*H01J 37/26*    (2006.01)

(52) U.S. Cl.
USPC ............................. 250/309; 250/306; 250/307

(58) Field of Classification Search
USPC .......................................... 250/306, 307, 309
See application file for complete search history.

(56) References Cited

U.S. PATENT DOCUMENTS

| | | | |
|---|---|---|---|
| 2009/0114840 A1* | 5/2009 | Ward et al. | 250/423 F |
| 2009/0152462 A1* | 6/2009 | Ishitani et al. | 250/307 |
| 2011/0147609 A1* | 6/2011 | Shichi et al. | 250/400 |

FOREIGN PATENT DOCUMENTS

| | | |
|---|---|---|
| JP | 4303276 B2 | 7/2009 |
| JP | 4695909 B2 | 6/2011 |

OTHER PUBLICATIONS

Ward et al., "Helium-Ion MIcroScopy", *Photonics Spectra*, Aug. 2007, 3pp.

* cited by examiner

*Primary Examiner* — Nicole Ippolito
(74) *Attorney, Agent, or Firm* — Myers Bigel Sibley & Sajovec, P.A.

(57) ABSTRACT

Microelectronic substrate inspection equipment includes a gas container which contains helium gas, a helium ion generator which is disposed in the gas container and converts the helium gas into helium ions and a wafer stage which is disposed under the gas container and on which a substrate to be inspected is placed. The equipment further includes a secondary electron detector which is disposed above the wafer stage and detects electrons generated from the substrate, a compressor which receives first gaseous nitrogen from a continuous nitrogen supply device and compresses the received first gaseous nitrogen into liquid nitrogen, a liquid nitrogen dewar which is connected to the compressor and stores the liquid nitrogen, and a cooling device that is coupled to the helium ion generator. The cooling device is disposed on the gas container, and cools the helium ion generator by vaporizing the liquid nitrogen. Related methods are also disclosed.

11 Claims, 11 Drawing Sheets

MICROELECTRONIC SUBSTRATE INSPECTION EQUIPMENT USING HELIUM ION MICROSCOPY

CROSS REFERENCE TO RELATED APPLICATION

This application claims priority from Korean Patent Application No. 10-2012-0003497 filed on Jan. 11, 2012 in the Korean Intellectual Property Office, the disclosure of which is incorporated herein by reference in its entirety.

BACKGROUND

1. Field of the Invention

The present inventive concepts relate to microelectronic substrate inspection equipment and microelectronic substrate inspection methods using the same.

2. Description of the Related Art

With the increasing precision of semiconductor processes, pattern sizes are becoming smaller, and step heights are becoming greater. To inspect a pattern to see if the pattern has been formed according to design values, optical inspection equipment is generally used. However, optical inspection equipment may have limitations in its detection capability due to optical diffraction. Since the process of detecting a fine pattern with a great step height requires an increasingly higher level of precision, inspection methods for detecting fine patterns are being researched.

To overcome the limitations of the optical inspection equipment, an object lens with a high numerical aperture (NA), light in a short-wavelength range (e.g., deep ultraviolet (DUV), extreme-ultraviolet (EUV)), or various light irradiation methods are being used. However, there may be limitations in increasing the numerical aperture by 1 or more or reducing the wavelength of a light source. To overcome the limitations of optical inspection equipment, electron beam inspection equipment, which images secondary electrons generated by irradiating electrons with high accelerated energy, has been introduced. Electron beam inspection technology has developed to a point where it can detect defects of about 10 nm and can provide a spatial resolution of several nanometers. However, an electron beam used by the electron beam inspection equipment can cause electric charges to be charged on a sample or cause damage and contamination of the sample. In addition, electron beam inspection equipment may require a high-vacuum or ultra-high vacuum operating environment and may only obtain 2D planar information, instead of stereoscopic information, due to its small depth of focus (DOF).

SUMMARY

Aspects of the present inventive concepts can provide inspection equipment which can obtain 3D stereoscopic information about a pattern formed on a microelectronic substrate using a helium ion microscope (HIM).

Aspects of the present inventive concepts also can provide inspection methods which are employed to measure a step height of a pattern on a microelectronic substrate using the microelectronic substrate inspection equipment.

However, aspects of the present inventive concepts are not restricted to the one set forth herein. The above and other aspects of the present inventive concepts will become more apparent to one of ordinary skill in the art to which the present inventive concepts pertain by referencing the detailed description of the present inventive concepts given below.

According to some aspects of the present inventive concepts, there is provided microelectronic substrate inspection equipment. The microelectronic substrate inspection equipment includes a helium gas container which contains helium gas, a helium ion generator which may be disposed in the gas container and is configured to convert the helium gas into helium ions and a wafer stage which may be disposed under the gas container in a path of the helium ions and on which a substrate to be inspected is placed. The microelectronic substrate inspection equipment also includes a secondary electron detector which is disposed adjacent and, in some embodiments above, the wafer stage, and is configured to detect electrons generated from the substrate, and a compressor which is configured to receive first gaseous nitrogen from a continuous nitrogen supply device and to compress the received first gaseous nitrogen into liquid nitrogen. The microelectronic substrate inspection equipment also includes a liquid nitrogen dewar which is connected to the compressor and is configured to store the liquid nitrogen, and a cooling device which is configured to cool, for example to continuously cool, the helium ion generator by vaporizing the liquid nitrogen received from the liquid nitrogen dewar into second gaseous nitrogen, which may be disposed on the helium gas container, and is coupled to the helium ion generator.

According to other aspects of the present inventive concepts, there is provided a microelectronic substrate inspection method, the method comprising, providing a microelectronic substrate having a pattern, irradiating helium ions onto the substrate, and measuring a step height of the pattern on the substrate by detecting particles generated from the substrate in response to the helium ions that are irradiated.

According to still other aspects of the present inventive concepts, there is provided a microelectronic substrate inspection method that comprises measuring a step height of a pattern on a microelectronic substrate using a helium ion microscope. Measuring may take place by measuring a slope width of the pattern at two different tilt angles of the substrate relative to the helium ion microscope. One of the two different tilt angles may be about zero degrees. Moreover, the helium ion microscope may be operated continuously during the measuring the slope of the pattern at the two different tilt angles.

BRIEF DESCRIPTION OF THE DRAWINGS

The above and other aspects and features of the present inventive concepts will become more apparent by describing in detail exemplary embodiments thereof with reference to the attached drawings, in which.

DETAILED DESCRIPTION OF EMBODIMENTS

Figure 1:
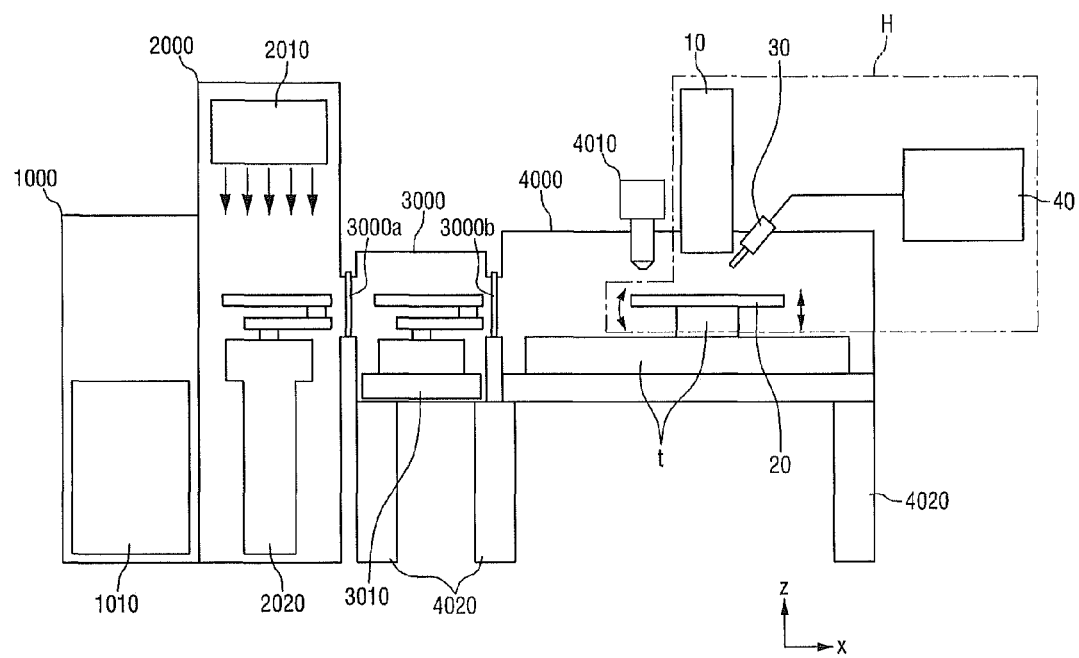
FIG. 1 is a schematic diagram of semiconductor substrate inspection equipment according to embodiments of the present inventive concepts.

The present inventive concepts will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concepts.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Various embodiments will now be described relative to inspection equipment for semiconductor substrates. However, it will be understood that various embodiments described herein may be used with any microelectronic substrate, such as a glass or other carrier substrate that includes dense microelectronic patterns. Hereinafter, semiconductor substrate inspection equipment according to some embodiments of the present inventive concepts will be described with reference to FIGS. 1 through 5.

Figure 2:
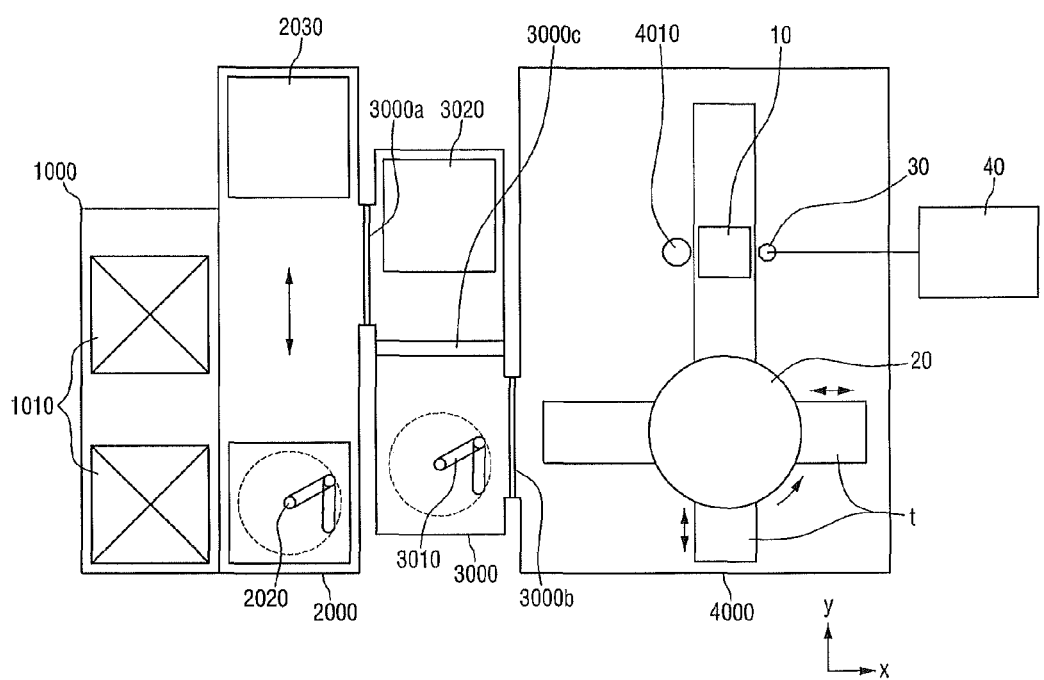
FIG. 2 is a schematic plan view of the semiconductor substrate inspection equipment shown in FIG. 1.
Figure 3:
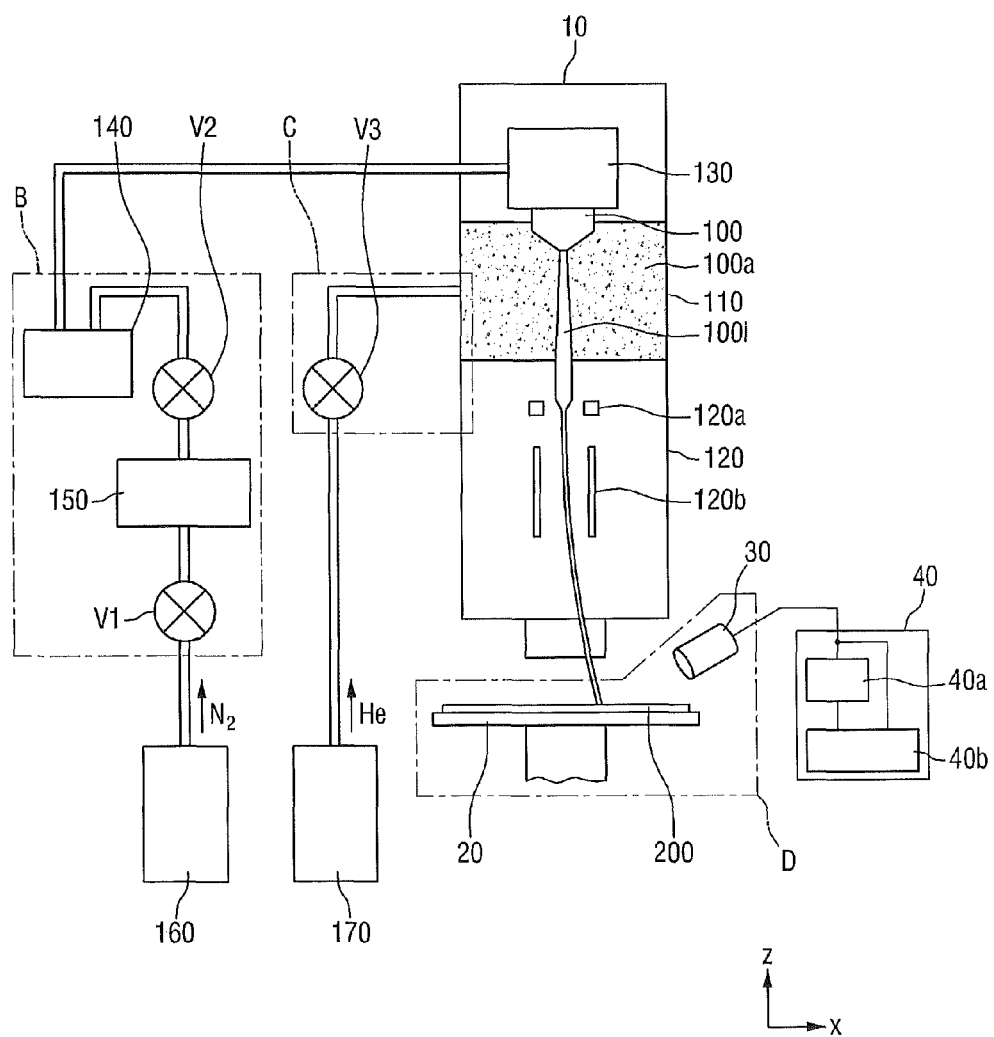
FIG. 3 is a schematic diagram of a helium ion microscope (HIM) used in semiconductor substrate inspection equipment according to embodiments of the present inventive concepts.
Figure 4:
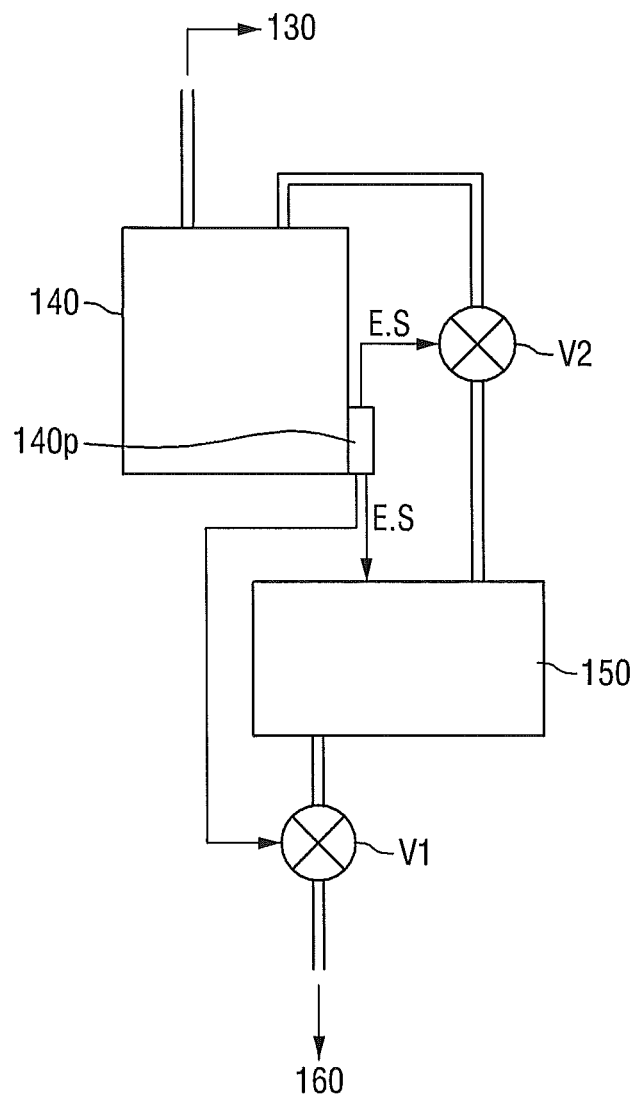
FIG. 4 shows a region B of FIG. 3.
Figure 5:
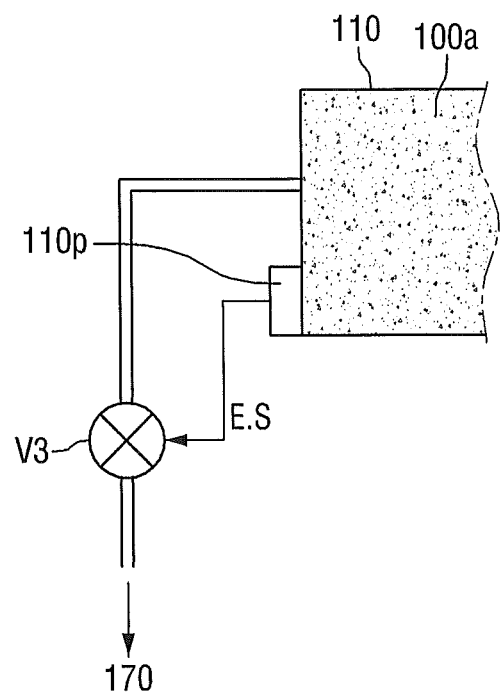
FIG. 5 shows a region C of FIG. 3.

FIG. 1 is a schematic diagram of semiconductor substrate inspection equipment according to some embodiments of the present inventive concepts. FIG. 2 is a schematic plan view of the semiconductor substrate inspection equipment shown in FIG. 1. FIG. 3 is a schematic diagram of a helium ion microscope (HIM) used in semiconductor substrate inspection equipment according to embodiments of the present inventive concepts. FIG. 4 shows a region B of FIG. 3. FIG. 5 shows a region C of FIG. 3.

Referring to FIGS. 1 and 2, the semiconductor substrate inspection equipment according to some embodiments of the present inventive concepts includes a load port 1000, a front-end module 2000, a load lock chamber 3000, a main chamber 4000, and a controller 40. The load port 1000 and the front-end module 2000 may be connected by a gate (not shown) through which semiconductor substrates can be moved. A surface of the front-end module 2000 which is not connected to the load port 1000 is connected to the load lock chamber 3000. The front-end module 2000 and the load lock chamber 3000 are connected to each other by a first gate valve 3000*a*. The load lock chamber 3000 and the main chamber 4000 may be connected to each other by a second gate valve 3000*b*. The first gate valve 3000*a* and the second gate valve 3000*b* may be provided to control the pressure between the front-end module 2000 and the load lock chamber 3000 and the pressure between the main chamber 4000 and the load lock chamber 3000, respectively. If there is no difference in pressure between the main chamber 4000 and the front-end module 2000, the first and second gate valves 3000*a* and 3000*b* and the load lock chamber 3000 can be omitted. The semiconductor substrate inspection equipment may be greatly affected by vibrations. Thus, the load lock chamber 3000 and the main chamber 4000 are supported by an anti-vibration system 4020 that can absorb shock. The controller 40 may be electrically connected to the main chamber 4000. In the drawings, the controller 40 is connected to a detector 30 included in the main chamber 4000. However, the present inventive concepts are not limited thereto.

Specifically, referring to FIGS. 1 and 2, the load port 1000 is a place to which substrates to be inspected are fed and includes a plurality of tables 1010 on which the substrates can be placed. A substrate to be inspected may be contained in a cassette and then fed to the load port 1000. However, the present inventive concepts are not limited thereto.

The front-end module 2000 is a place where a substrate to be inspected is moved and may be maintained at atmospheric pressure. The front-end module 2000 includes a first robot arm 2020 and a filter 2010. The first robot arm 2020 may transfer a substrate placed on a table 1010 of the load port 1000 to a first holder 3020 of the load lock chamber 3000. Since the first robot arm 2020 can transfer substrates to be inspected from a plurality of tables 1010 to the load lock chamber 3000, it may move in a second direction y. The filter 2010 causes air to flow from an upper part of the front-end module 2000 to a lower part. If particles (such as dust) adhere to a substrate to be inspected, they may cause errors in the inspection of the substrate. Therefore, the filter 2010 may always move air downward.

The load lock chamber 3000 may include the first holder 3020 and a second robot arm 3010. The first holder 3020 and the second robot arm 3010 may be located in separate places in the load lock chamber 3000, and the separate places may be connected by a third gate valve 3000c. The first holder 3020 is where a substrate transferred by the first robot arm 2020 is placed. The second robot arm 3010 may transfer a substrate placed on the first holder 3020 to a second holder 20 (also referred to as a "wafer stage 20") in the main chamber 4000. The load lock chamber 3000 may be connected to a vacuum pump (not shown) in order to control the pressure inside the load lock chamber 3000. When the pressure inside the main chamber 4000 is maintained low, the pressure inside the load lock chamber 3000 may be adjusted to prevent failures of the semiconductor substrate inspection equipment due to a pressure difference between the main chamber 4000 and the load lock chamber 300.

Referring to FIGS. 1 and 2, the main chamber 4000 may include the second holder 20, a second holder movement track t, a helium ion module 10, the detector 30, and an optical microscope 4010. The second holder 20 is where a substrate transferred by the second robot arm 3010 is placed. The second holder 20 can be used as a wafer stage when a substrate is inspected using an HIM. After being loaded with a substrate by the second robot arm 3010, the second holder 20 may move to where the helium ion module 10 is located along the second holder movement track t. The second holder 20 may move in a first direction x and the second direction y to adjust the positional relationship between the substrate and the helium ion module 10 and may move in a third direction z to adjust the focus. The second holder 20 may rotate about an optical axis of the helium ion module 10 to align the substrate. In addition, the second holder 20 may be tilted with respect to an axis included in the second holder 20, so that the substrate can be inspected in a tilted position. For example, the second holder 20 may be tilted with respect to an x axis or a y axis, thereby tilting the substrate.

The helium ion module 10 is equipment that irradiates helium ions onto a substrate placed on the second holder 20. The helium ion module 10 is fixed to the main chamber 4000 since the movement of the helium ion module 10 can change set values of the semiconductor substrate inspection equipment. The detector 30 detects particles, e.g., secondary electrons, generated from a substrate by helium ions irradiated to the substrate. In FIG. 1, the detector 30 is fixed to the periphery of the main chamber 4000. However, the present inventive concepts are not limited thereto. That is, the detector 30 can be located in an internal space of the main chamber 4000 and/or can rotate around the second holder 20. The optical microscope 4010 may be used to optically inspect the surface of a substrate. The helium ion module 10 and the detector 30 will be described in greater detail later with reference to FIGS. 3, 7 and 8.

The controller 40 can control the semiconductor substrate inspection equipment according to various embodiments of the present inventive concepts. In FIGS. 1 and 2, the controller 40 is connected to the detector 30. However, this is for illustrative simplicity only, and the present inventive concepts are not limited thereto. For example, the controller 40 may convert a signal detected by the detector 30 into an image signal. The controller 40 may control the operation of the helium ion module 10, the movement of the second holder 20 and/or the operation of the load lock chamber 3000. The controller 40 may include a calculator 40a (see FIG. 3) which can measure a step height of a pattern using an image obtained by the detector 30. Specifically, a pattern having a step may be formed on a substrate to be inspected. In this case, the calculator 40a of the controller 40 may measure a step height of the pattern formed on the substrate using an image obtained by the detector 30 through the inspection of the substrate. Specific embodiments for measuring a step height of a pattern will be described in greater detail later with reference to FIGS. 9 and 10.

A process in which substrates to be inspected are moved in the semiconductor substrate inspection equipment will now be described briefly with reference to FIGS. 1 and 2. A plurality of cassettes (not shown) containing substrates to be inspected are fed into the load port 1000. The first robot arm 2020 picks up a substrate from a cassette and transfers the substrate to the first holder 3020 of the load lock chamber 3000. Here, the place where the first holder 3020 is located and the front-end module 2000 may be made to have the same pressure. The pressure in the place where the first holder 3020 is located in the load lock chamber 3000 and the pressure in the place where the second robot arm 3010 is located in the load lock chamber 3000 are adjusted to be the same. Then, the third gate valve 3000c is opened. The second robot arm 3010 transfers the substrate placed on the first holder 3020 to the second holder 20 in the main chamber 4000. Here, the pressure in the place where the second robot arm 3010 is located and the pressure in the main chamber 4000 are adjusted to be the same. Then, the second gate valve 3000b is opened. The substrate placed on the second holder 20 is moved to under the helium ion module 10 by the second holder movement track t. The detector 30 detects particles generated by helium ions irradiated from the helium ion module 10, and the controller 40 connected to the detector 30 displays the detected particles as an image. If a pattern having a step is formed on the substrate, the calculator 40a of the controller 40 measures a height of the step and displays the measured step height.

Referring to FIGS. 3 through 5, a HIM used in an embodiment of the present inventive concepts includes a helium ion module 10 (see FIG. 1), a wafer stage 20, a secondary electron detector 30, and a controller 40. The helium ion module 10 includes a helium gas container 110, a helium ion generator 100, a tube 120, and a cooling device 130. FIG. 3 shows a region H of FIG. 1.

Semiconductor substrate inspection equipment according to some embodiments of the present inventive concepts includes a gas container 110, a helium ion generator 100 located in the helium gas container 110, and a tube 120 located under the gas container 110. The semiconductor substrate inspection equipment further includes the wafer stage 20 located under the tube 120, a secondary electron detector 30 located over the wafer stage 20, a cooling device 130 disposed on the gas container 110 and coupled to the helium ion generator 100, and a controller 40 connected to the secondary electron detector 30. The semiconductor substrate inspection equipment further includes a liquid nitrogen dewar 140 and a compressor 150 sequentially connected to the cooling device 130. As known to those having skill in the art, a dewar is a double walled flask of, for example, metal and/or silvered glass, with a vacuum or other substance such as liquid nitrogen, between the walls, that is used to hold liquids at well below ambient temperature.

Specifically, the helium ion generator 100 converts helium gas 100a into helium ions. The helium ion generator 100 is located in the gas container 110 that contains the helium gas 100a. In the drawings, a part of the helium ion generator 100 is located within the gas container 110, and the other part of the helium ion generator 100 protrudes upward from the gas container 110. However, the whole of the helium ion generator 100 can also be located within the gas container 110. An electrode (not shown) is installed under the helium ion generator 100 in order to apply a high voltage to the helium ion generator 100. Since the helium ion generator 100 is maintained at a low temperature by the cooling device 130, the helium gas 100a adheres to the helium ion generator 100. Here, the helium gas 100a loses electrons to the helium ion generator 100 and is released at high speed toward the wafer stage 20 to form helium ions 100i. Since the helium ions 100i form a helium ion beam, it will hereinafter be understood that the helium ion beam contains the helium ions 100i.

Referring to FIGS. 3 and 5, the helium ion generator 100 is installed in the gas container 110, and the helium gas 100a having a pressure higher than a reference pressure is contained in the gas container 110. A part of the gas container 110 may serve as a path of the helium ion beam 100i generated by the helium ion generator 100.

The gas container 110 may receive the helium gas 100a from a continuous helium supply device 170. The continuous helium supply device 170 is a device that continuously supplies the helium gas 100a for at least about 24 hours. The continuous helium supply device 170 may be, for example, a utility line of a semiconductor production line. A plurality of gas bombes can also be connected to form the continuous helium supply device 170 which supplies the helium gas 100a. However, it may be efficient to use the utility line of the semiconductor production line as the continuous helium supply device 170 in order for the space utilization of the semiconductor production line.

Referring to FIG. 5, the gas container 110 may further include a first pressure gauge 110p which measures the pressure of the helium gas 100a in the gas container 110 and a third valve v3. The third valve v3 may be located between the gas container 110 and the continuous helium supply device 170. The first pressure gauge 110p may be electrically connected to the third valve v3. However, this is merely an example. That is, each of the first pressure gauge 110p and the third valve v3 may be connected to the controller 40. The first pressure gauge 110p and the third valve v3 may operate as follows. When a pressure measured by the first pressure gauge 110p is lower than the reference pressure, the first pressure gauge 110p transmits an electrical signal E.S to the third valve v3. In response to the electrical signal E.S, the third valve v3 is opened to supply the helium gas 100a to the gas container 110. Conversely, when the pressure measured by the first pressure gauge 110p is higher than the reference pressure, the first pressure gauge 110p transmits an electrical signal E.S to the third valve v3. In response to the electrical signal E.S, the third valve v3 is closed. However, the above operation is merely an example. The third valve v3 can also be opened or closed manually by observing the pressure measured by the first pressure gauge 110p and/or by using the controller 40.

Referring to FIGS. 3 and 4, the cooling device 130 is placed above the gas container 110 and coupled to the helium ion generator 100 so as to cool the helium ion generator 100. The cooling device 130 may use, for example, liquid nitrogen. The helium ion generator 100 needs to be maintained at an extremely low temperature to efficiently generate the helium ion beam 100i. To this end, the cooling device 130 can reduce or prevent the temperature of the helium ion generator 100 from increasing, so that the helium ion beam 100i can be generated in a stable manner. Therefore, it may be desirable for the cooling device 130 to continuously supply, e.g., liquid nitrogen to the helium ion generator 100 in order to continuously cool the helium ion generator 100.

Referring to FIG. 3, the liquid nitrogen dewar 140, the compressor 150, and a continuous nitrogen supply device 160 are sequentially connected to the cooling device 130. In addition, a second valve v2 and a first valve v1 are respectively connected between the liquid nitrogen dewar 140 and the compressor 150 and between the compressor 150 and the continuous nitrogen supply device 160. The continuous nitrogen supply device 160 is a device that continuously supplies nitrogen gas for at least about 24 hours. The continuous nitrogen supply device 160 may be, for example, a utility line of a semiconductor production line. A plurality of gas bombes can also be connected to form the continuous nitrogen supply device 160 which supplies nitrogen gas. However, it may be efficient to use the utility line of the semiconductor production line as the continuous nitrogen supply device 160 in order for the space utilization of the semiconductor production line.

Referring to FIG. 3, the compressor 150 generates liquid nitrogen using first gaseous nitrogen received from the continuous nitrogen supply device 160, e.g., the utility line of the semiconductor production line. The liquid nitrogen generated by the compressor 150 is sent to the liquid nitrogen dewar 140 and stored in the liquid nitrogen dewar 140. The liquid nitrogen dewar 140 which stores the liquid nitrogen continuously supplies the liquid nitrogen to the cooling device 130. The liquid nitrogen supplied from the liquid nitrogen dewar 140 is evaporated into second gaseous nitrogen by the cooling device 130 and, at the same time, cools the helium ion generator 100. In other words, nitrogen that cools the helium ion generator 100 is changed to the first gaseous nitrogen between the compressor 150 and the continuous nitrogen supply device 160, to the liquid nitrogen by the liquid nitrogen dewar 140, and then to the second gaseous nitrogen by the cooling device 130. Through this process, the cooling device 130 continuously cools the helium ion generator 100.

Referring to FIG. 4, the liquid nitrogen dewar 140 may further include a second pressure gauge 140p that measures the hydraulic pressure of the liquid nitrogen in the container. The second pressure gauge 140p may be electrically connected to the compressor 150 and the first and second valves v1 and v2. However, this configuration is merely an example. That is, the second pressure gauge 140p can be connected to the controller 40, and each of the compressor 150 and the first and second valves v1 and v2 can be connected to the controller 40. The compressor 150, the first and second valves v2 and v3, and the second pressure gauge 140p may operate as follows. When a pressure measured by the second pressure gauge 140p is lower than the reference pressure, the second pressure gauge 140p transmits an electrical signal E.S to the first and second valves v1 and v2 and the compressor 150. In response to the electrical signal E.S, the first valve v1 is opened to supply the first gaseous nitrogen to the compressor 150. Also, in response to the electrical signal E.S, the second valve v2 is opened to allow the compressed liquid nitrogen to be stored in the liquid nitrogen dewar 140. Conversely, when the pressure measured by the second pressure gauge 140p is higher than the reference pressure, the second pressure gauge 140p transmits an electrical signal E.S to the first and second valves v1 and v2 and the compressor 150. In response to the electrical signal E.S, the first and second valves v1 and v2 are closed, and the compressor 150 stops running. However, the above operation is merely an example. The first and second valves v1 and v2 can also be opened or closed manually and the compressor 150 can also be operated manually by observing the pressure measured by the second pressure gauge 140p. In addition, the second pressure gauge 140p can operate the first and second valves v2 and v3 and the compressor 150 using the controller 40.

Referring to FIG. 3, the tube 120 is disposed under the gas container 110, and the helium ion beam 100i generated by the helium ion generator 100 flies in the tube 120. The tube 120 may include a lens 120a and a deflector 120b. The lens 120a may control the size of the helium ion beam 100i, and the deflector 120b may control the direction of the helium ion beam 100i.

Referring to FIGS. 2 and 3, the wafer stage 20 is located under the tube 120 in the path of the helium ion beam 100i, and a substrate 200 to be inspected is placed on the wafer stage 20. The wafer stage 20 may be the second holder 20 of FIG. 1. The wafer stage 20 may move in first through third directions x, y, and z which are different from each other. The wafer stage 20 may rotate the substrate 200 so that the helium ion beam 100i can reach a location to be measured on the substrate 200. In addition, the wafer stage 20 may be tilted so that the substrate 200 can be measured in a tilted position or that the substrate 200 can level off when loaded wrongly. In other words, the substrate 200 can be moved by the wafer stage 20 with five degrees of freedom. However, this is merely an example used to describe the embodiment of the present inventive concepts, and the present inventive concepts are not limited to this example.

Referring to FIG. 3, the secondary electron detector 30 is located above the substrate 200 and detects secondary electrons generated from the substrate 200. The secondary electron detector 30 may be fixed in position or rotate around the substrate 200 (see 30 in FIGS. 7 and 8) to detect secondary electrons generated from the substrate 200. The secondary electron detector 30 collects and/or detects secondary electrons generated from the substrate 200 by the helium ion beam 100i incident on the substrate 200. The secondary electron detector 30 detects the amount of secondary electrons generated from the substrate 200 and sends information about the detected amount to the controller 40.

Referring to FIG. 3, the controller 40 may include a display 40b which displays information received from the secondary electron detector 30 and a calculator 40a which calculates a step height of a pattern formed on the substrate 200 using the received information. In some embodiments, the display 40b displays a signal detected by the secondary electron detector 30 as an image. The display 40b displays an enlarged image of the substrate 200 brightly when a large amount of electrons are detected by the secondary electron detector 30 and darkly when a small amount of electrons are detected by the secondary electron detector 30. The calculator 40a included in the controller 40 will be described later. Other displays, such as numeric and/or graphic displays may be provided.

Semiconductor substrate inspection equipment according to other embodiments of the present inventive concepts will now be described with reference to FIG. 6. The current embodiment is the same as the previous embodiment except for a gas container 110. Therefore, elements substantially identical to those of the previous embodiment are indicated by like reference numerals, and thus their description will not be repeated or made briefly.

Figure 6:
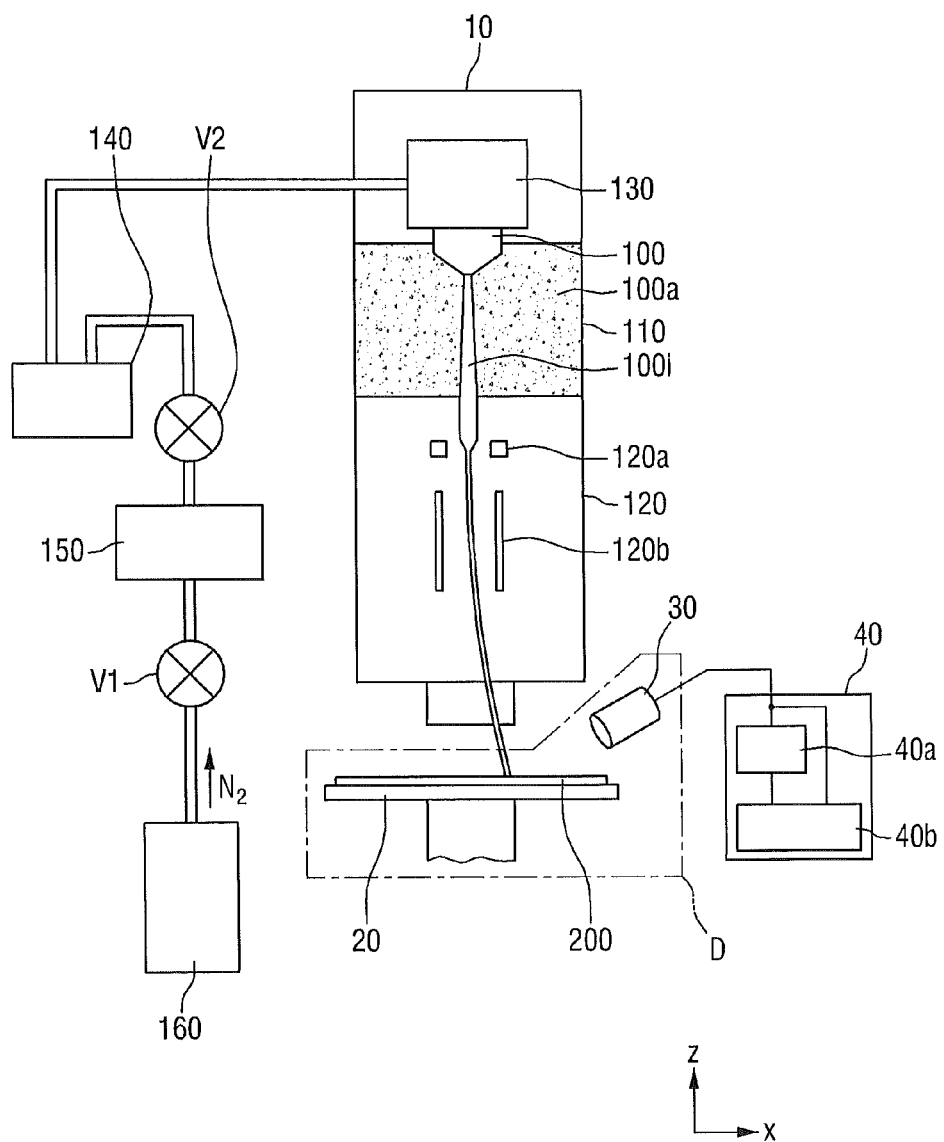
FIG. 6 is a diagram of an HIM used in semiconductor substrate inspection equipment according to other embodiments of the present inventive concepts.

FIG. 6 is a diagram of an HIM used in semiconductor substrate inspection equipment according to other embodiments of the present inventive concepts.

Referring to FIG. 6, a gas container 110 containing helium gas 100a is disposed on a tube 120, and a helium ion generator 100 is disposed in the gas container 110. The gas container 110 does not include a line connected to a continuous helium supply device. When the HIM is used, the helium gas 100a is injected into the gas container 110 through a gas inlet (not shown) formed in the gas container 110. When the helium gas 100a runs short while the HIM is being used, it can be replenished through the gas inlet. The gas inlet can have any shape. Since the gas container 110 is just not connected to the continuous helium supply device, a line can be connected to the gas container 110 as in FIG. 3, and a helium gas bombe can be connected to the line. The gas container 110 may further include a pressure gauge 110p. However, the present inventive concepts are not limited thereto.

Semiconductor substrate inspection equipment according to other embodiments of the present inventive concepts will now be described with reference to FIGS. 7 and 8. These embodiments are the same as the previous embodiment described above with reference to FIGS. 3 through 5, except for a secondary electron detector 30. Therefore, elements substantially similar to those of the previous embodiment are indicated by like reference numerals, and thus their description will not be repeated or made briefly.

Figure 7:
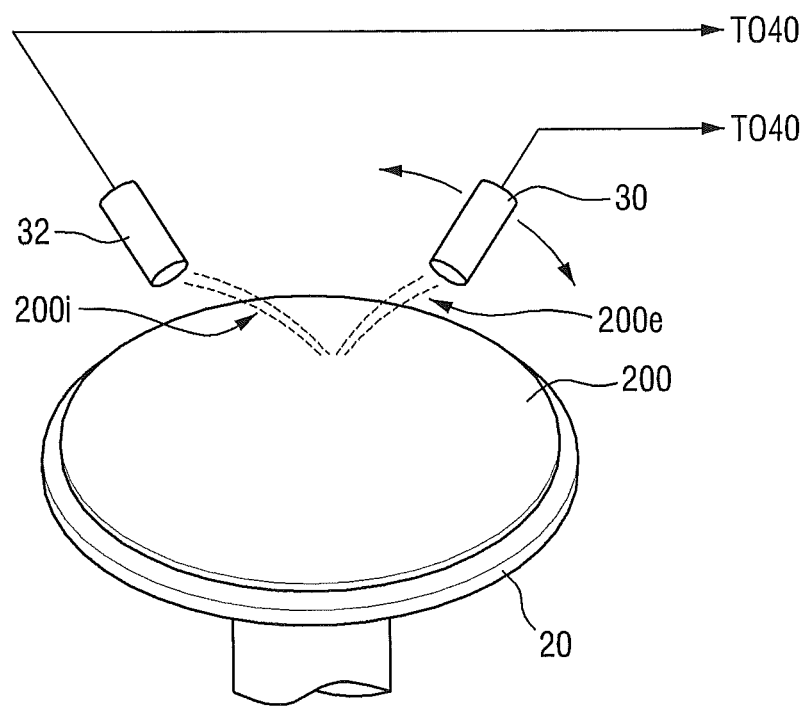
FIGS. 7 and 8 are diagrams of detectors used in semiconductor substrate inspection equipment according to other embodiments of the present inventive concepts.
Figure 8:
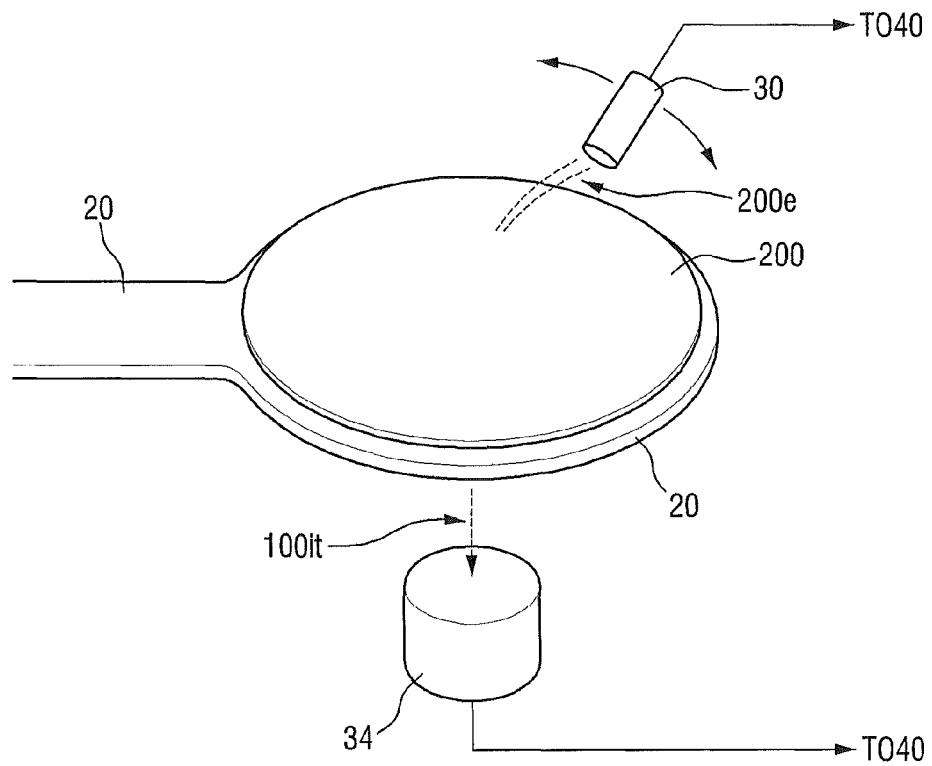

FIGS. 7 and 8 are diagrams of detectors used in semiconductor substrate inspection equipment according to other embodiments of the present inventive concepts.

Referring to FIG. 7, a secondary electron detector 30 and an ion detector 32 are placed above a wafer stage 20. When a helium ion beam is incident on a substrate 200 to be inspected, the secondary electron detector 30 detects secondary electrons 200e generated from substrate 200. Information about the detected secondary electrons 200e is transmitted to a controller 40 and displayed on a display as an image. In addition, the ion detector 32 detects ions 200i sputtered from the substrate 200. Information about the detected ions 200i is sent to the controller 40 and imaged by the display. The mass of helium ions is several thousand times greater than that of electrons. Therefore, a large amount of ions may be sputtered from the substrate 200, unlike when electrons are used to inspect the substrate 200. The sputtered ions 200i are called Rutherford backscattering ions (RBIs), and the ion detector 32 detects the RBIs. The amount of RBIs may vary according to the material composition (dependent on atomic number Z) of the substrate 200. Therefore, the difference between materials existing in the substrate 200 can be obtained as image information. The presence of the ion detector 32 makes it possible to use the semiconductor substrate inspection equipment to detect defects through a contamination and chemical analysis of the substrate 200.

Referring to FIG. 8, a secondary electron detector 30 is placed above a wafer stage 20, and a transmission ion detector 34 is placed under the wafer stage 20. When a helium ion beam is incident on a substrate 200 to be inspected, the secondary electron detector 30 detects secondary electrons 200e emitted upward from the substrate 200. On the other hand, the transmission ion detector 34 detects helium ions 100it that transmit through the substrate 200. A portion of the substrate 200 upon which the helium ion beam is incident should be thin enough to allow the helium ion beam to transmit therethrough. Thus, the substrate 200 may be processed to a thickness small enough to allow the helium ion beam to transmit therethrough. In this case, if information about the transmitted helium ions 100it detected by the transmission ion detector 34 is sent to a controller 40 and imaged by the display, a diffraction grating pattern of the substrate 200 is created. From the diffraction grating pattern, the crystal structure of the substrate 200, the stress state of the substrate 200, the matching relation of patterns formed on the substrate 200, and the like can be identified. That is, measurements similar to those that can be obtained using a transmission electron microscope (TEM) can be obtained using an HIM.

In FIGS. 7 and 8, the ion detector 32 or the transmission ion detector 34 is provided in addition to the secondary electron detector 30 according to an embodiment of the present inventive concepts. However, this is merely an embodiment. For example, both of the ion detector 32 and the transmission ion detector 34 can also be provided in addition to the secondary electron detector 30. Therefore, two or three detectors can be installed in the HIM.

Figure 11:
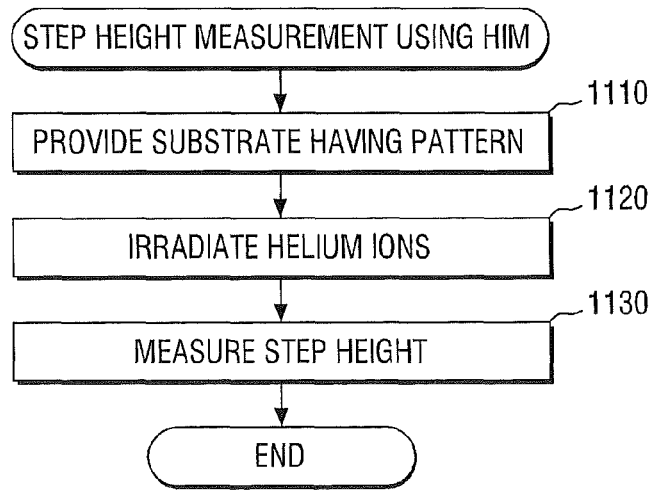
FIGS. 11 and 12 are flowcharts of operations that may be performed to measure step height according to various embodiments of the present inventive concepts.

FIG. 11 is a flowchart of operations that may be performed to measure a step height of a pattern of a microelectronic substrate using a helium ion microscope according to various embodiments described herein. As illustrated in FIG. 11, step height measurement may be performed by providing a microelectronic substrate having a pattern at Block 1110, irradiating helium ions onto the substrate at Block 1120 and measuring a step height of the pattern on the substrate by detecting particles generated from the substrate at Block 1130, in response to the helium ions that are irradiated at Block 1120.

Figure 12:
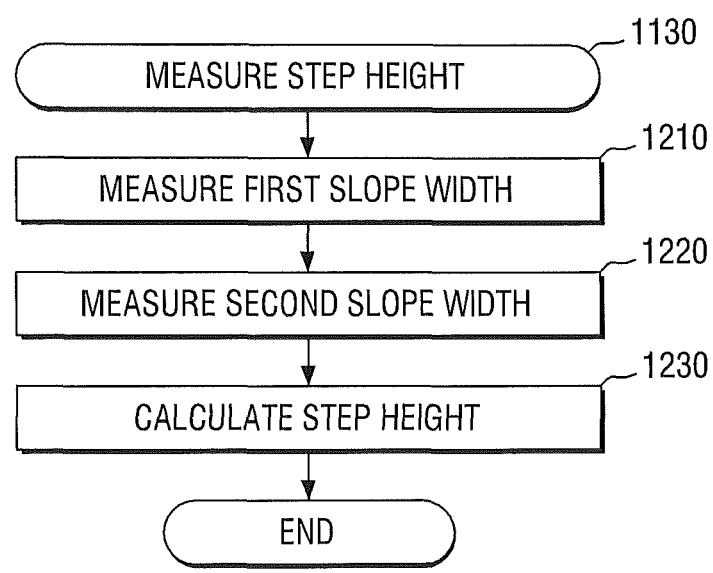

FIG. 12 is a flowchart of operations that may be performed to measure step height corresponding to Block 1130 of FIG. 11. Referring to FIG. 12, at Block 1210 a first slope width of the pattern is measured by analyzing first electrons detected from the substrate before tilting the substrate. At Block 1220, a second slope width of the pattern is measured by analyzing second electrons detected from the substrate after tilting the substrate. Finally, at Block 1230, the step height of the pattern is calculated from the first and second slope widths that are measured. Various embodiments of step height measurement of FIG. 11 and of measuring step height of FIG. 12 will now be described.

Semiconductor substrate inspection equipment according to other embodiments of the present inventive concepts will now be described with reference to FIGS. 9A through 10B. These embodiments are the same as the previous embodiments described above with reference to FIGS. 3 through 5, except for a controller 40. Therefore, elements substantially identical to those of the previous embodiment are indicated by like reference numerals, and thus their description will not be repeated or made briefly.

FIGS. 9A through 10B are diagrams illustrating a calculation of a controller 40 used in semiconductor substrate inspection equipment according to other embodiments of the present inventive concepts.

Figure 9A:
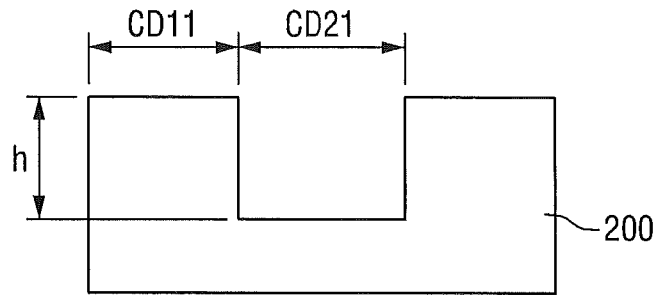
FIGS. 9A through 10B are diagrams illustrating a calculation of a controller used in semiconductor substrate inspection equipment according to other embodiments of the present inventive concepts.

Referring to FIG. 9A, a pattern is cut into a substrate 200 to be inspected. The pattern has a height of h and a width of CD21. The substrate 200 is placed on a wafer stage without being tilted (i.e., a tilt angle of about zero). That is, the substrate 200 has no slope width. Here, the slope width refers to a width of a sidewall of the pattern when the pattern on the substrate 200 is shown in a plane. In addition, the width of the pattern denotes a width of the pattern when the pattern on the substrate 200 is shown in a plane. Referring to FIG. 3, when the substrate 200 is not tilted, undeflected helium ions 100$i$ are irradiated to the substrate 200 in a direction perpendicular to the substrate 200. That is, the undeflected helium ions 100$i$ are substantially parallel to a normal to the substrate 200.

Figure 9B:
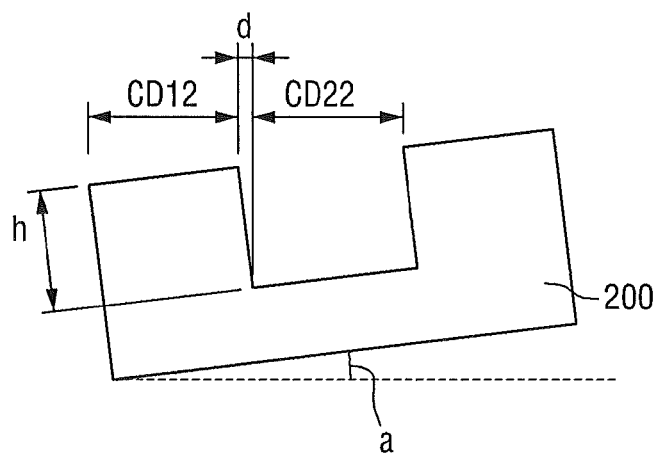

Referring to FIG. 9B, when the substrate 200 is tilted at an angle of a, the width of the pattern becomes CD22, and the slope width becomes d. Even if the substrate 200 is tilted at an angle of a, the height of the pattern remains at h. The relation between the height h of the pattern, the slope width d, and the tilt angle a of the substrate 200 can be defined using a trigonometric function as in Equation (1).

$$h = d/\sin(a) \quad (1).$$

Referring to FIGS. 9A and 9B, a rectangular pattern having a slope width of 0, a width of CD21 and a height of h is provided on a substrate 200. After the substrate 200 is tilted, if the slope width is measured using an HIM, the height h of the pattern can be obtained from the relation defined by Equation (1).

Calculating a height of a pattern when the pattern having a general shape is formed on a substrate will now be described with reference to FIGS. 10A and 10B.

Figure 10A:
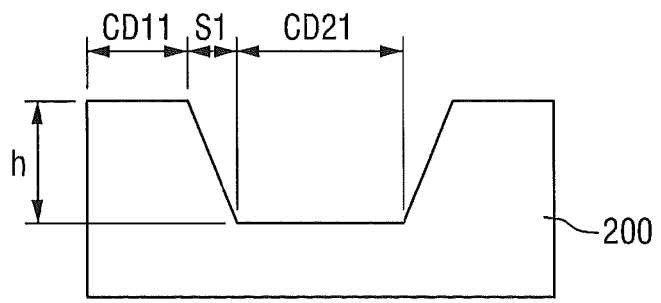

Referring to FIG. 10A, a pattern is provided in a substrate 200 to be inspected, corresponding to Block 1110 of FIG. 11. The pattern has a height of h and a slope width of S1, and a lower part of the pattern has a width of CD21. In FIG. 10A, the substrate 200 is placed on a wafer stage without being tilted.

Figure 10B:
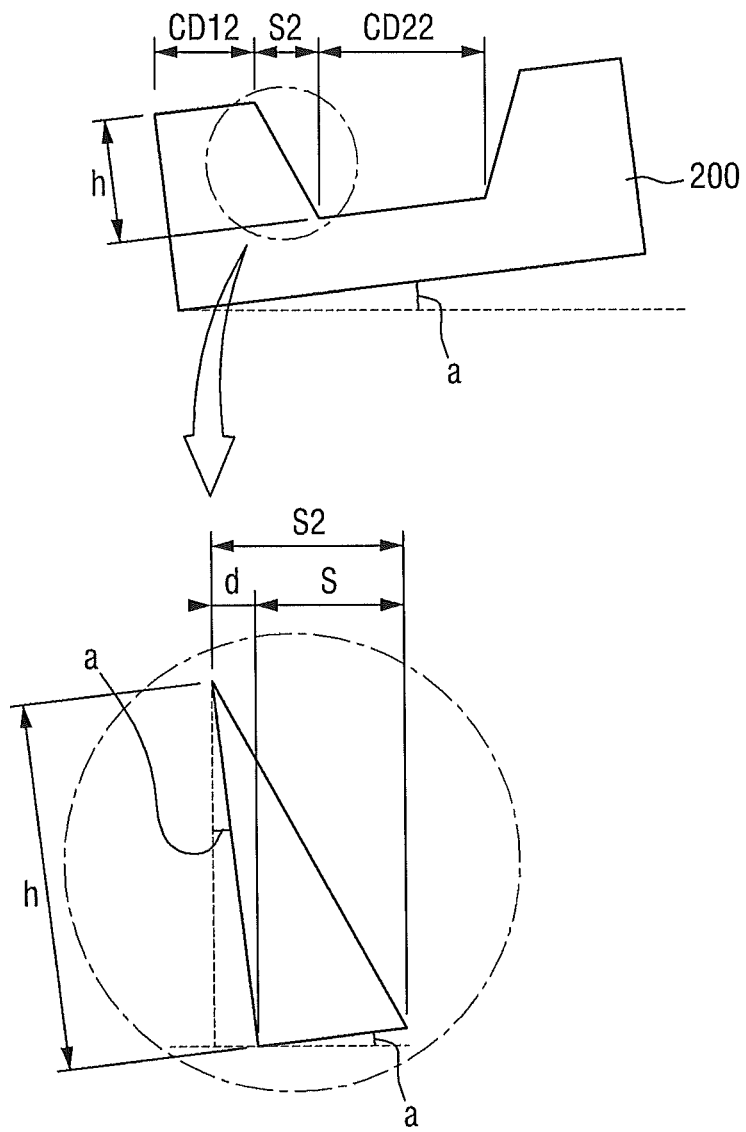

Referring to FIG. 10B, the substrate 200 is tilted at an angle of a. In this case, the width of the lower part of the pattern becomes CD22, and the slope width becomes S2. Even if the substrate 200 is tilted at an angle of a, the height of the pattern remains at h. The relation between the height h of the pattern, the slope width d, and the tilt angle a of the substrate 200 is obtained using a trigonometric function. The slope width S2 after the substrate 200 is tilted is the sum of a portion S resulting from the slope width S1 before the substrate 200 is tilted and a portion d resulting from the height h of the pattern. In addition, a cosine component of the slope width S1 before the substrate 200 is tilted is S. This can be defined by Equations (2) and (3).

$$S2 = S + d \quad (2).$$

$$S = S1 * \cos(a) \quad (3).$$

The relation between the height h of the pattern and the slope width d resulting from the height h of the pattern still satisfies Equation (1). Therefore, Equations (2) and (3) can be rearranged and substituted for Equation (1) to obtain the relation defined by Equation (4).

$$h = (S2 - S1 * \cos(a))/\sin(a) \quad (4).$$

In Equation (4), if zero is substituted for the slope width S1 before the substrate 200 is tilted, the same result as that of Equation (1) can be obtained.

Referring to FIGS. 10A and 10B, a trapezoidal pattern is formed on a substrate 200 to be inspected. The pattern has a slope width of S1 and a height of h, and a width of a lower part of the pattern is CD21. The slope width S1 before the substrate 200 is tilted is measured using an HIM, corresponding to Block 1210 of FIG. 12, and the slope width S2 after the substrate 200 is tilted is measured using the HIM, corresponding to Block 1220 of FIG. 12. Then, the height h of the pattern can be obtained from the relation defined by Equation (4), corresponding to Block 1230 of FIG. 12.

Referring to FIGS. 3 and 9A through 10B, a calculator 40$a$ included in the controller 40 of the semiconductor substrate inspection equipment according to embodiments of the present inventive concepts can measure a step height of a pattern formed on a substrate 200 to be inspected. The calculator 40$a$ can calculate the step height of the pattern formed on the substrate 200 based on the relations defined by Equations (1) and (4). In FIGS. 9A through 10B, a case where a height of a pattern formed intentionally is measured is illustrated. However, step heights of defects formed on the substrate 200 can also be calculated using the calculator 40$a$.

The gas container 110 and the detectors described above with reference to FIGS. 6 through 8 can be applied to the semiconductor substrate inspection equipment which includes the calculator 40$a$ described above with reference to FIGS. 9A through 10B.

Hereinafter, a semiconductor substrate inspection method according to embodiments of the present inventive concepts will be described with reference to FIGS. 3 and 9A through 10B.

Referring to FIG. 3, a substrate 200 to be inspected is provided on a wafer stage 20. Patterns, such as the pattern shown in FIG. 9A or 10A, are provided on the substrate 200, corresponding to Block 1110 of FIG. 11. Helium ions 100i generated by a helium ion generator 100 of an HIM are irradiated to the substrate 200, corresponding to Block 1120 of FIG. 11. Particles (e.g., secondary electrons) generated as the helium ions 100i collide with the substrate 200 are detected by a detector 30. By analyzing the detected particles, the shape or step height of the patterns formed on the substrate 200 is measured, corresponding to Block 1130 of FIG. 11. The following description will be based on the assumption that the particles generated from the substrate 200 are secondary electrons.

First, the secondary electrons generated from the substrate 200 may be analyzed, and the surface shape of the substrate 200, for example, the patterns formed on the substrate 200 may be displayed on a display 40b based on the analysis of the secondary electrons. To obtain a clear image based on the surface shape of the substrate 200 displayed on the display 40b, focal distance, the intensity of helium ions, and the like may be adjusted. In addition, the wafer stage 20 may be rotated or tilted between the irradiating of the helium ions 100i to the substrate 200 and the measuring of the step height of the patterns formed on the substrate 200. The patterns formed on the substrate 200 may be patterns arranged in an arbitrary direction. For example, to measure the shape or step height of the patterns arranged in an arbitrary direction, the substrate 200 may need to be rotated. Specifically, a direction in which the substrate 200 is inspected may be different from a direction of the patterns formed on the substrate 200. In this case, for efficient pattern inspection, the substrate 200 placed on the wafer stage 20 may be rotated to align the inspection direction with the direction of the patterns. That is, between the irradiating of the helium ions 100i to the substrate 200 and the measuring of the step height of the patterns formed on the substrate 200, the direction of the patterns may be adjusted by rotating the substrate 200 in order to align the inspection direction of the substrate 200 with the direction of the patterns formed on the substrate 200.

Referring to FIG. 3, the undeflected helium ions 100i may be perpendicularly incident on the wafer stage 20 without the substrate 200. In this state, if the substrate 200 is placed on the wafer stage 20, the undeflected helium ions 100i may be perpendicularly incident on the substrate 200. However, particles may exist between the wafer stage 20 and the substrate 200, or a thickness of an adhesive member may not be uniform. In this case, the undeflected helium ions 100i may not be perpendicularly incident on the substrate 200. Then, errors may occur when the step height of the patterns formed on the substrate 200 is measured. To reduce or prevent such errors, the substrate 200 may need to be put in a non-tilted position. Therefore, the slope of the substrate 200 placed on the wafer stage 20 may be adjusted before the step height of the patterns formed on the substrate 200 is measured, so that the undeflected helium ions 100i are perpendicularly irradiated to the substrate 200.

Referring to FIGS. 3, 10A and 10B, the detector 30 detects first secondary electrons generated from the substrate 200 in a non-tilted position, that is, before the substrate 200 is tilted. The controller 40 connected to the detector 30 measures a first slope width S1 of the patterns formed on the substrate 200 by analyzing the first secondary electrons, corresponding to Block 1210 of FIG. 12. Then, the substrate 200 is tilted at an angle of a. The detector 30 detects second secondary electrons generated from the tilted substrate 200. The controller 40 measures a second slope width S2 of the patterns formed on the substrate 200 by analyzing the second secondary electrons, corresponding to Block 1220 of FIG. 12. Using the measured first slope width S1 and the measured second slope width S2, the controller 40 calculates the step height of the patterns formed on the substrate 200, corresponding to Block 1230 of FIG. 12. The controller 40 can calculate the step height of the patterns using Equation (4) described above.

Accordingly, microelectronic substrates may be inspected according to various embodiments described herein by measuring a step height of a pattern on a microelectronic substrate using an HIM. The measuring may take place by measuring a slope width of the pattern at two different tilt angles of the microelectronic substrate relative to the helium ion microscope. One of the two different tilt angles may be about zero degrees. The helium ion microscope may be operated continuously during the measuring of the slope width of the pattern at the two different tilt angles of the microelectronic substrate relative to the helium ion microscope.

The step height of a pattern can be measured more accurately using an HIM than using a conventional SEM for at least the following reasons.

Theoretically, a maximum spatial resolution of the HIM is approximately 0.25 nm. Therefore, when the HIM is used, a pattern at a distance of more than 0.25 nm can be identified using a measured image. Since a width of a fine pattern can also be identified using the HIM, accurate measurement is possible. In addition, a relatively greater amount of secondary electrons are generated from the surface of a substrate when the HIM is used than when the SEM is used. Therefore, a high-contrast, sharp image can be obtained using the HIM. Also, since different ions are generated according to respective elements, an image with sharp contrast can be obtained. Further, compared with the SEM, the HIM has a large depth of field (DOF) and high resolution due to its very small half conical angle and small volume of interaction with a substrate to be inspected. The DOF is a value indicating the distance in front of and behind a subject which appears to be in focus. Since the HIM has a large DOF, it can obtain a sharp image as sharp as a planar image of even a pattern with a large step height. Therefore, when the HIM is used, blurry images which are out of focus can be reduced, and a width of a pattern can be measured using a sharp image. Using precise measured values, the step height of a pattern can be calculated precisely by Equation (1) or (4).

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

While the present inventive concepts have been particularly shown and described with reference to various embodiments thereof, it will be understood by those of ordinary skill in the art that various changes in form and details may be made therein without departing from the spirit and scope of the present inventive concepts as defined by the following claims. It is therefore desired that the present embodiments be considered in all respects as illustrative and not restrictive, reference being made to the appended claims rather than the foregoing description to indicate the scope of the invention.

What is claimed is:

1. Microelectronic substrate inspection equipment comprising:
   a helium gas container containing helium gas;

a helium ion generator that is configured to convert the helium gas into helium ions;

a wafer stage which is disposed in a path of the helium ions and is configured for placing a microelectronic substrate to be inspected thereon;

a secondary electron detector which is disposed adjacent the wafer stage and is configured to detect electrons generated from the substrate;

a compressor which is configured to receive first gaseous nitrogen from a continuous nitrogen supply device and to compress the received first gaseous nitrogen into liquid nitrogen;

a liquid nitrogen dewar which is connected to the compressor and is configured to store the liquid nitrogen; and a cooling device which is coupled to the helium ion generator and configured to cool the helium ion generator by vaporizing the liquid nitrogen received from the liquid nitrogen dewar into second gaseous nitrogen.

2. The inspection equipment of claim 1:
wherein the helium ion generator is disposed in the helium gas container;
wherein the wafer stage is disposed under the helium gas container;
wherein the secondary electron detector is disposed above the wafer stage; and
wherein the cooling device is disposed on the helium gas container.

3. The inspection equipment of claim 1, wherein when pressure of the liquid nitrogen dewar is a reference pressure or less, the compressor compresses the first gaseous nitrogen received from the continuous nitrogen supply device into the liquid nitrogen and stores the liquid nitrogen in the liquid nitrogen dewar.

4. The inspection equipment of claim 3, further comprising a valve disposed between the helium gas container and the helium supply device and a pressure gauge connected to the helium gas container.

5. The inspection equipment of claim 4, wherein the valve is opened or closed in response to a signal received from the pressure gauge.

6. The inspection equipment of claim 1, wherein the helium gas container receives helium gas from a continuous helium supply device.

7. The inspection equipment of claim 1, further comprising an ion detector which is disposed above the wafer stage and detects ions sputtered from the substrate.

8. The inspection equipment of claim 1, further comprising a transmission ion detector which is disposed under the wafer stage and detects the helium ions which transmit through the substrate.

9. The inspection equipment of claim 1, wherein the wafer stage is configured to move the substrate in three different directions, rotate the substrate, and/or tilt the substrate.

10. The inspection equipment of claim 1, wherein the secondary electron detector is configured to rotate around the wafer stage.

11. The inspection equipment of claim 1, further comprising a display which displays a signal received from the secondary electron detector as an image.

* * * * *